United States Patent
Kinrot et al.

(10) Patent No.: US 6,737,665 B1
(45) Date of Patent: May 18, 2004

(54) EDGE DETECTOR

(75) Inventors: Uri Kinrot, Hod-Hasharon (IL); Opher Kinrot, Raanana (IL)

(73) Assignee: OTM Technologies, Ltd., Herzelia (IL)

(*) Notice: Subject to any disclaimer, the term of this patent is extended or adjusted under 35 U.S.C. 154(b) by 0 days.

(21) Appl. No.: 10/070,192

(22) PCT Filed: Aug. 26, 1999

(86) PCT No.: PCT/IL99/00467
§ 371 (c)(1),
(2), (4) Date: Feb. 26, 2002

(87) PCT Pub. No.: WO01/14231
PCT Pub. Date: Mar. 1, 2001

(51) Int. Cl.[7] .............................................. G01N 21/86
(52) U.S. Cl. ............................ 250/559.36; 250/223 R; 356/614
(58) Field of Search ..................... 250/341.8, 559.36, 250/559.11, 559.01, 559.32, 206, 202; 356/28, 28.5, 614–615, 639–636, 430–431, 622

(56) References Cited

U.S. PATENT DOCUMENTS

| | | | | |
|---|---|---|---|---|
| 4,470,696 A | * | 9/1984 | Ballard | 356/28.5 |
| 5,216,478 A | * | 6/1993 | Kadowaki et al. | 356/28.5 |
| 5,229,830 A | * | 7/1993 | Ishida et al. | 356/28.5 |
| 5,504,345 A | * | 4/1996 | Bartunek | |
| 5,859,440 A | * | 1/1999 | Acquaviva | 250/559.36 |
| 6,404,506 B1 | * | 6/2002 | Cheng et al. | 356/634 |

FOREIGN PATENT DOCUMENTS

| | | |
|---|---|---|
| EP | 0 548 848 | 6/1993 |
| EP | 0 942 285 | 9/1999 |
| WO | WO 98/18103 | 4/1998 |

OTHER PUBLICATIONS

Matsumura,K.; JP 10–111306; Apr. 28, 1998 & Patent Abstracts of Japan; Jul. 31, 1998; vol. 1998; No. 09.

Watabe, T.; JP 05–052950; Mar. 2, 1993 & Patent Abstracts of Japan; Jul. 6, 1993, vol. 017; No. 357 (P–1568).

* cited by examiner

*Primary Examiner*—David Porta
*Assistant Examiner*—Patrick J. Lee
(74) *Attorney, Agent, or Firm*—Fenster & Company

(57) ABSTRACT

A method of detecting the passage of an edge of a moving sheet of material at a position comprising: monitoring a state of motion at a position; and determining a time of an edge of the sheet at a position as a time at which a change in a state of motion at the position is detected.

27 Claims, 8 Drawing Sheets

EDGE DETECTOR

RELATED APPLICATIONS

The present application is a U.S. national application of PCT/IL99/00467, filed Aug. 26, 1999.

FIELD OF THE INVENTION

The present invention is related to the field of edge detection and in particular to the field of optical detection of edges and the detection of edges based on the detection of motion.

BACKGROUND OF THE INVENTION

Detection of the edge of a moving surface is useful in many fields such as printing, in which the position of the edge of a moving sheet of paper at some position or time is often measured to allow for alignment between the sheet and a printing engine.

Edge detectors for sheets in the prior art are based on mechanical or optical detection of the presence of the sheet. For example, in some such detectors, a lever or other indicator may be moved from one position to another by the presence of a sheet. In others an optical sensor determines the presence of a sheet by detecting either the blocking of radiation by the sheet or, alternatively by detecting radiation reflected by the sheet.

SUMMARY OF THE INVENTION

An aspect of some preferred embodiments of the invention is concerned with the detection of an edge from detection of its movement.

In preferred embodiments of the inventions, a point or area at which the presence of an edge of a moving surface is to be detected is monitored for movement. Prior to the arrival of the edge, no movement is detected. As the edge passes the point or area, the movement of the edge is detected and the presence thereof is determined. It should be noted that in some preferred embodiments of the invention, the presence of the surface itself is not directly determined. Rather, it is only determined indirectly from a preferably sudden change in the measured state from no measured velocity to a velocity above a certain threshold or within a predetermined range.

In a preferred embodiment of the invention, the velocity is measured optically. In this preferred embodiment of the invention, an optical velocitometer or the like is used to measure velocity (or to determine its presence) at a point, an edge or an area. In principle, any optical velocitometer may be used; however, in preferred embodiments of the invention, specially constructed optical measurement devices are utilized which take account of simplifications that are possible since an accurate measurement of the velocity is not necessary, only of its existence or change relative to some reference. In some preferred embodiments of the invention, to increase accuracy of timing of the passage of the edge, the beam is shaped. This shaping may be to reduce the size of the interrogated area or, more preferably, may provide an edge of radiation at the arrival edge of the surface.

In preferred embodiments of the invention, no measurement of the presence of the presence of the surface is made, unless it is in motion.

In a preferred embodiment of the invention, the edge is the edge of a sheet, such as of paper or plastic. Preferably, the sheet travels along a platen. The detector detects a transition from no motion to motion and the moment of time of transit of the edge is determined from the time of the transition.

In preferred embodiments of the invention, the motion is detected from a Doppler shift of radiation, preferably from a laser, that is reflected from the surface of the moving object (sheet).

There is thus provided, in accordance with a preferred embodiment of the invention a method of detecting the passage of an edge of a moving sheet of material at a position, comprising:

monitoring a state of motion at a position; and determining a time of an edge of the sheet at a position as a time at which a change in a state of motion at the position is detected.

Preferably, the method comprises:

determining a time of passage of a leading edge as a time at which motion is first detected.

Preferably, the method comprises:

determining a time of passage of a trailing edge of the sheet as a time at which detection of motion ceases.

In a preferred embodiment of the invention, wherein monitoring a state of motion comprises optically monitoring whether motion of an object exists at the position.

Preferably, monitoring comprises determining if a Doppler shift exists between radiation illuminating the position and radiation reflected at the position.

In a preferred embodiment of the invention, the presence of motion is determined to exist if the power of the reflected illumination within a band of Doppler frequencies is above a threshold.

Preferably, the threshold for determining onset of motion is different from the threshold for determining cessation of motion.

Preferably, the method includes providing a local oscillator for determining the Doppler shifts.

In a preferred embodiment of the invention, a portion of the illuminating radiation is used as a local oscillator in detecting Doppler shifts. Preferably, the local oscillator comprises optical radiation reflected from a surface. Alternatively, the local oscillator comprises radiation back diffracted from a diffracting surface.

In a preferred embodiment of the invention, the local oscillator is focused on a sensor used to detect the Doppler shifts. Preferably, the local oscillator is focused essentially to a point.

In a preferred embodiment of the invention, the position is comprised in an area illuminated by radiation, said area comprising an entrance side at which a sheet enters the area and an exit side at which the sheet leaves the area. Preferably, the radiation illuminating the area is formed to provide a sharp illumination boundary at at least one of the entrance and exit sides of said area. More preferably, the radiation illuminating the area is formed to provide a sharp illumination boundary at both the entrance and exit sides of the area.

In a preferred embodiment of the invention, the arrival of an edge is determined by Doppler energy produced at said entrance side of said area by a leading edge of said sheet. In a preferred embodiment of the invention, a trailing edge is determined by a cessation of detection of Doppler energy from said exit side of said position from a trailing edge of said sheet.

In a preferred embodiment of the invention, the position has an extent between entrance and said exit side. Preferably, the extent is between about 1 mm and about 5 mm, more preferably between about 2 mm and about 4 mm and typically, about 2 mm.

In a preferred embodiment of the invention, the method includes detecting the presence of a non-moving sheet between the entrance and exit.

In a preferred embodiment of the invention, the method includes measuring the velocity of the sheet.

In a preferred embodiment of the invention, the method includes measuring the distance the sheet translates.

In a preferred embodiment of the invention, the radiation is IR radiation.

In a preferred embodiment of the invention, the radiation is laser illumination.

In a preferred embodiment of the invention, the time at which a sheet enters the position is determined to an accuracy, better than about 0.5 mm/v sec, and more preferably 0.1 mm/v sec where v is the velocity of the sheet.

BRIEF DESCRIPTION OF THE DRAWINGS

The present invention will be more clearly understood from the following description of the preferred embodiments thereof, taken together with the following drawings, in which the same or similar reference signs are used to indicate the same or similar elements.

DETAILED DESCRIPTION OF PREFERRED EMBODIMENTS OF THE INVENTION

Figure 1A:
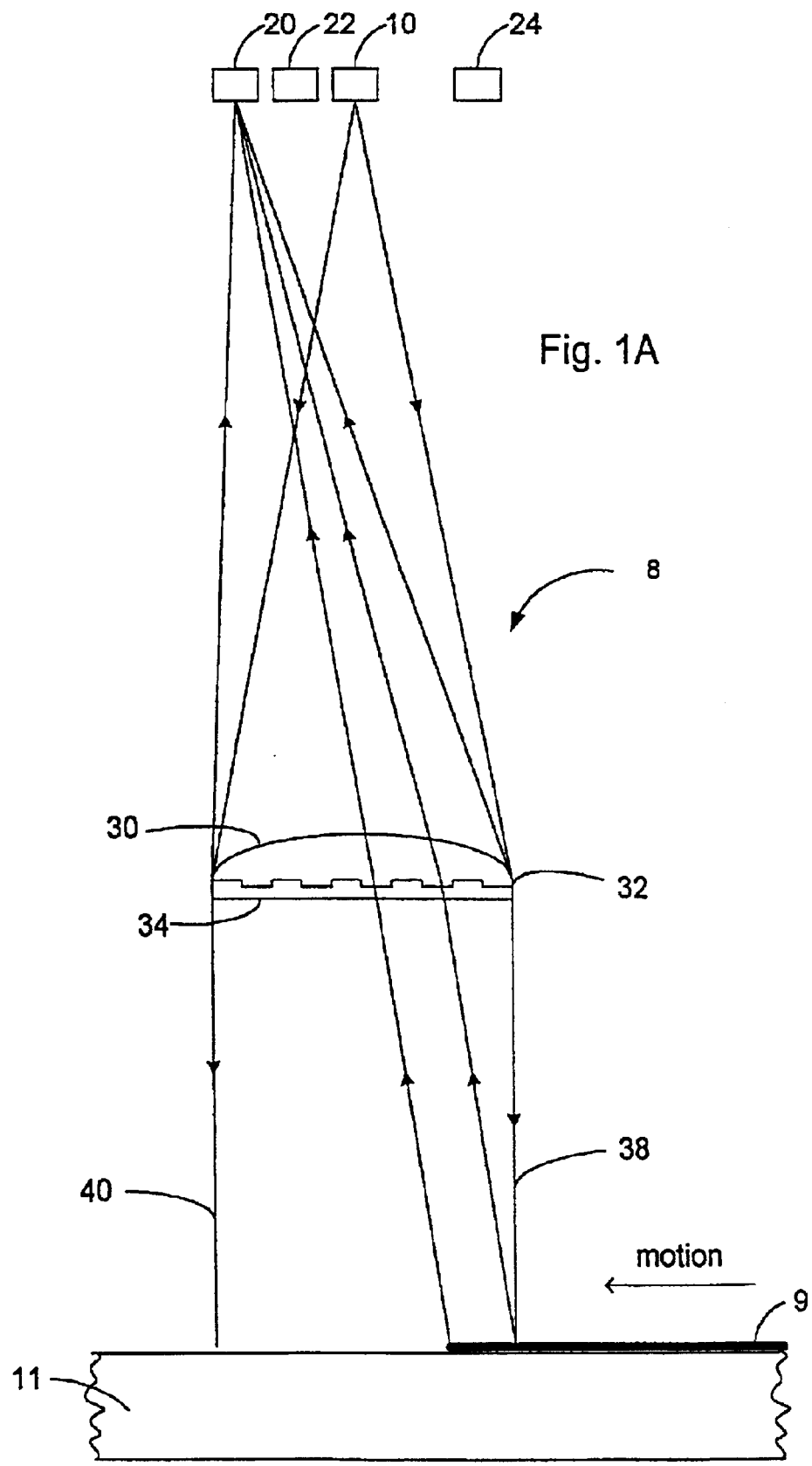
FIG. 1A is a schematic drawing of an edge detector, detecting the leading edge of a moving sheet, in accordance with a preferred embodiment of the invention.

FIG. 1A is a schematic drawing of an edge detector 8, in accordance with a preferred embodiment of the invention, for detecting the leading edge of a moving sheet.

Edge detector 8 comprises an at least partially coherent radiation source 10 (for example, a diode laser such as a VCSEL operating in the IR), a front-edge and motion sensor 20, an optional presence sensor 22 and/or a rear-edge and motion sensor 24. Sensors 20, 22 and 24 are for example photodiodes or other sensors known in the art, and are sensitive to radiation emitted by source 10, but are preferably not sensitive to radiation far from the wavelength of the source emission. In some preferred embodiments of the invention, a filter is placed in front of sensors 20, 22 and 24 to provide said selective sensitivity.

Edge detector 8 utilizes the Doppler shift of radiation scattered from an incident object 9 (for example a sheet of paper) to discriminate it from a substantially stationery background. Preferably, the paper is fed along a platen 11 or the like, for example, when the detector is used in a printer, copier or the like. Platen 11 is preferably made of or coated with a material with little or no reflection of the radiation generated by radiation source 10. Preferably, the surface of platen 11 has a matte finish. Alternatively, platen 11 is formed with a hole where it is impinged by the illumination, such that substantially nothing is reflected at that point toward the detector. Since the area of the detector is quite small, there is no loss of support of the paper because of the hole. Such reflection, while it has little or no affect on the motion measurements, may affect the presence measurement described below.

Radiation from source 10 is preferably, collimated by a lens 30. After passing through lens 30, part of the radiation is back-diffracted by a grating 32 and focused by lens 30 onto sensor 20. This radiation is referred to herein as a "local oscillator" (LO) field. (In other preferred embodiments of the invention, the LO field may be generated in other ways.) Grating 32 is preferably a phase grating (the grating grooves are exaggerated for clarity) although other suitable grating types are useful in some preferred embodiments of the invention. Preferably grating 32 is formed on or in the lower surface of lens 30.

Figure 1B:
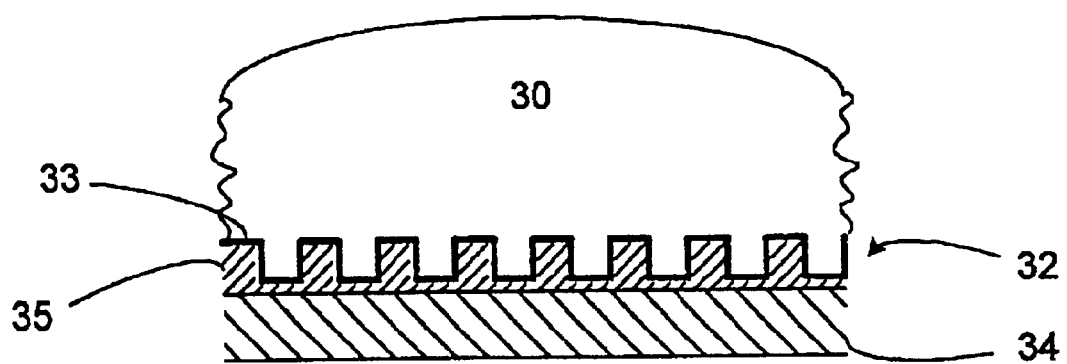
FIG. 1B shows a detail of the structure of an element of FIG. 1A.

FIG. 1B shows details of construction of grating 32. In a preferred embodiment of the invention, in which grating 32 is formed in the surface of the lens, the grating is preferably coated by a metallic or dielectric coating 33 and filled with dielectric material 35 (such as an optical glue) of substantially the same index of refraction as lens 30, such that the radiation that passes through the grating forms substantially only a single beam ('illumination beam'), transmitted toward the surface. Coating 33 acts, in this construction, solely to cause back diffraction of the illumination to the sensors. The characteristics of coating 33 determine the percent of back-diffracted illumination. Other methods and structures which provide a single beam (and requisite reflected beam or beams) are usable, in other preferred embodiments of the invention. Preferably, grating 32 (and coating 33) is further coated or covered with a protective layer 34. In preferred embodiments of the invention in which layer 34 acts as a filter to pass only the wavelength of the source and nearby wavelengths, such filters can generally be omitted from the sensors.

Part of the radiation illuminating and reflected from object 9 (and to the extent that it is reflective, from stationary background 11) is focused by lens 30 onto sensor 20 and interferes with the LO field. Sensor 20 generates a Doppler signal responsive to the interference between the LO and the radiation reflected from object 9. The Doppler frequency is preferably measured, indicating the object translation or velocity. Reflections, if any, from stationery background 11 produce no Doppler signal.

Preferably, the illuminating beam forms an abrupt edge of illumination at a front edge of illumination 38, providing steep rise in the signal responsive to the illumination of the edge of an incoming sheet of paper. Preferably, the illuminating beam also forms a straight edge of illumination at an exit edge of illumination 40. In some preferred embodiments of the invention, tapering of the edges of the beam is used to decrease beam side-lobes. This tapering and the formation of the edge itself are preferably produced by phase-contouring of the lens or using varied amplitude-transmission function, as known in the art of laser beam shaping.

Preferably, object 9 and grating 32 are situated well within the coherence length of source 10 such that the LO and reflected beams are coherent at sensor 20. Placing object 9 and gating 32 at a spacing greater than the coherence length, reduces the signal to noise level of the determination.

Object 9 (i.e., the surface of the paper or other moving object) is preferably diffusive, thus the illumination onto object 9 is reflected in a generally broad space angle. Essentially only the reflection parallel to the direction of the diffracted LO from grating 32 interferes with the LO focused on sensor 20. Preferably, at least part of the reflection from object 9 which interfere with a LO field, overlaps the LO beam.

Thus, preferably the spacing between the object and the grating is bounded by $H<W/\tan(\alpha)$, where H is the optical path between the grating and the object, W the beamwidth along the motion measurement direction, and $\alpha$ is the angle between illuminating beam and the LO beam direction Typical dimensions and values used in a practical device are source wave length 850 nm, beam width 2 mm, height above sheet 0–5 mm, grating pitch $\Lambda=10$ micrometer and overall detector height dimension of 5–10 mm from the moving object. For a paper velocity V=500 mm/sec this results in a Doppler frequency $F=V/\Lambda=50$ kHz. Of course, other wavelengths, spacings, beam width, etc., will occur to practitioners of the art and are suitable for other preferred embodiments of the invention. Such dimensions allow for determination of the time of arrival of the leading edge of the sheet and the time of exit of the trailing edge of the sheet to within 0.5 mm/V sec and more preferably to within 0.1 mm/V sec.

Figure 2A:
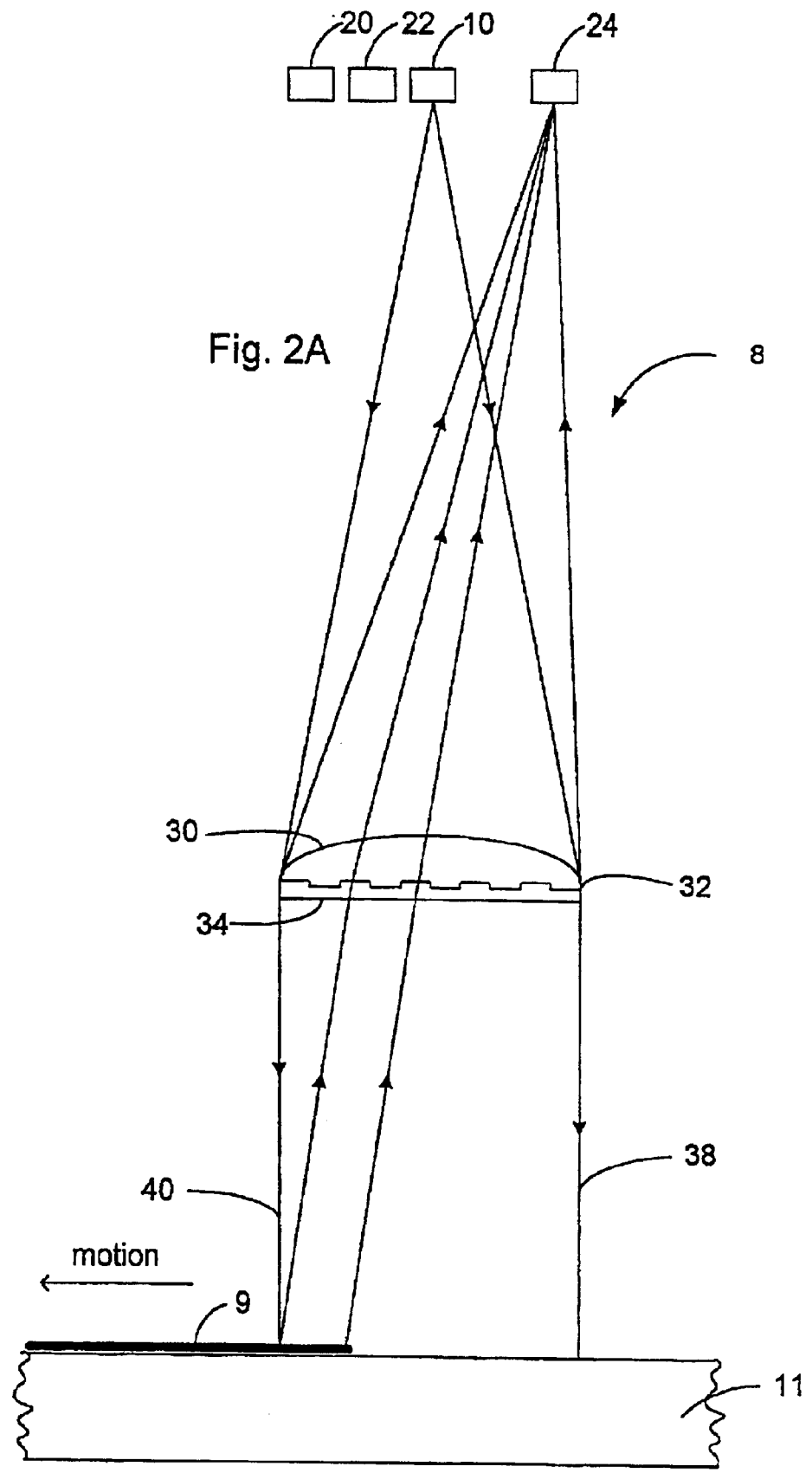
FIGS. 2A and 2B show the use of edge detector of FIG. 1 in detecting the trailing edge of a moving sheet and in detecting the length of the sheet.

FIG. 2A illustrates the use of detector 8 to detect the rear edge of object 9, in accordance with a preferred embodiment of the invention. In some preferred embodiments of the invention, in which only trailing edge detection is desired, sensor 20 may be omitted and the beam passing through grating 32 may be formed to provide only the illumination sensor 24 to detect the trailing-edge of the object, as it exits the illumination beam.

Trailing edge detection, as shown in FIG. 2A is similar to that used for front-edge detection, however, the velocity information gathered in the measurement of sensor 20 may be used to improve the detection by reducing the noise bandwidth.

Figure 2B:
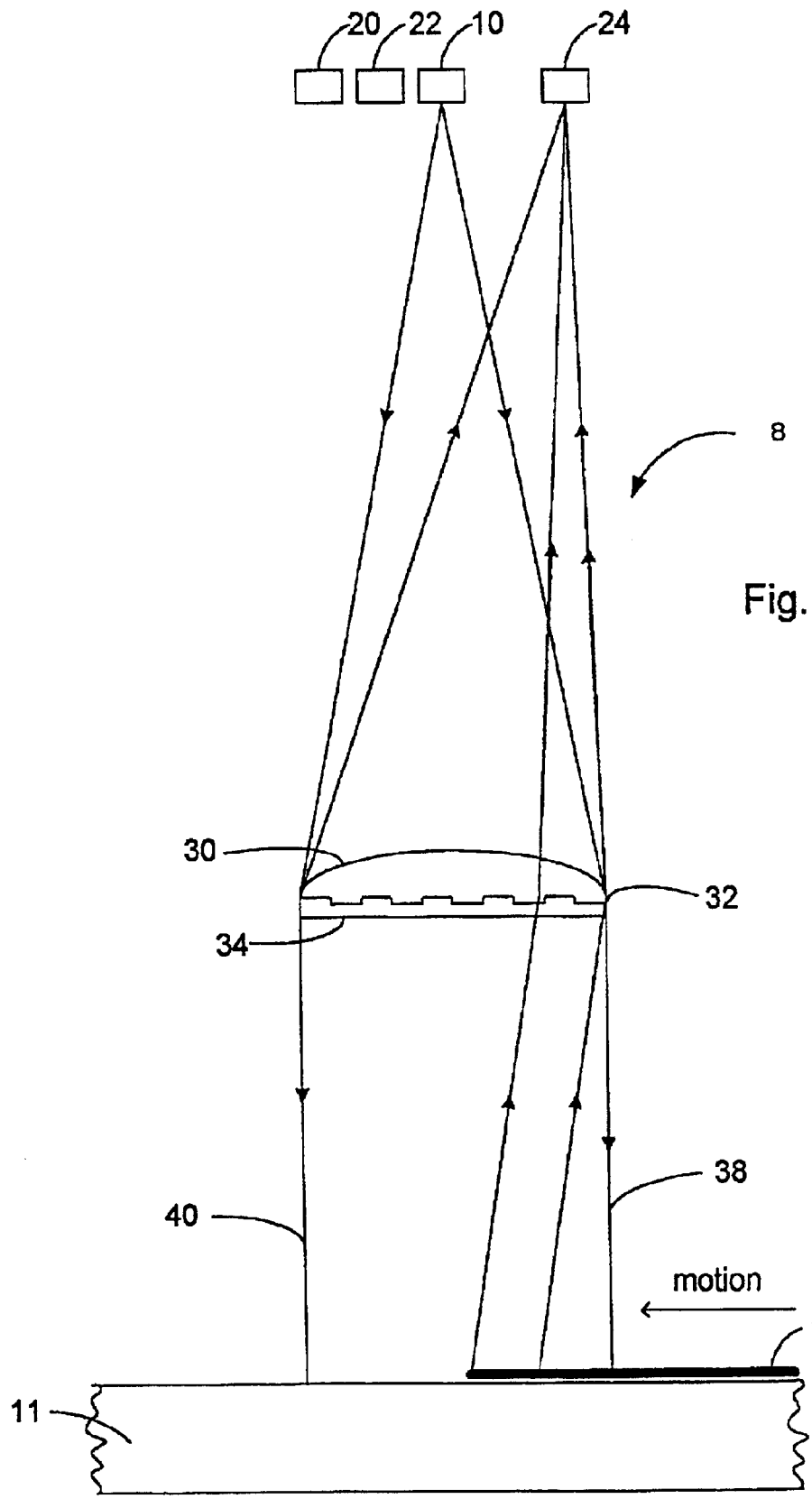

The signal at sensor 24 rises sharply when the reflection from the front edge of the object in the direction of the LO beam starts to overlap the LO beam reflected from grating 32, as shown in FIG. 2B. Thus, the delay between the rise of sensor 20 signal and the rise of sensor 24 signal depends an the spacing between the grating 32 and the object 9 according to $T_H = H \tan(\alpha)/V$, where $T_H$ is the delay between the signals, H the spacing between grating 32 and object 9, V the velocity of object 9 and $\alpha$ the diffraction angle to sensor 24. This relation enables to estimate the object spacing from the grating from the delay between the signals and from the velocity information. Here and throughout the detailed description, the invention is described with respect to normal incidence of the illumination on the sheet. This is only for convenience of exposition. Such incidence, or measurement of light reflected (diffracted) perpendicularly to the sheet results in height independence of the measurement. However, non-incident incident and reflected light may be used in some less preferred embodiments of the invention.

The delay between the detection of front edge by sensor 20 and the detection of rear edge by sensor 24 is given by $T_L=(L+W)/V$, wherein L is the object length (e.g., paper length), W is the beamwidth along the motion measurement direction and V the object velocity. This relation enables calculating the object length, irrespective of its spacing from the grating. (i.e., independent from H).

It should be understood that while optimal accuracy is achieved by using separate sensors for leading and trailing edge detection, a single detector will detect both leading and trailing edges, with lesser accuracy. Such a single detector can also be used, with proper filtering, to detect presence.

Figure 3:
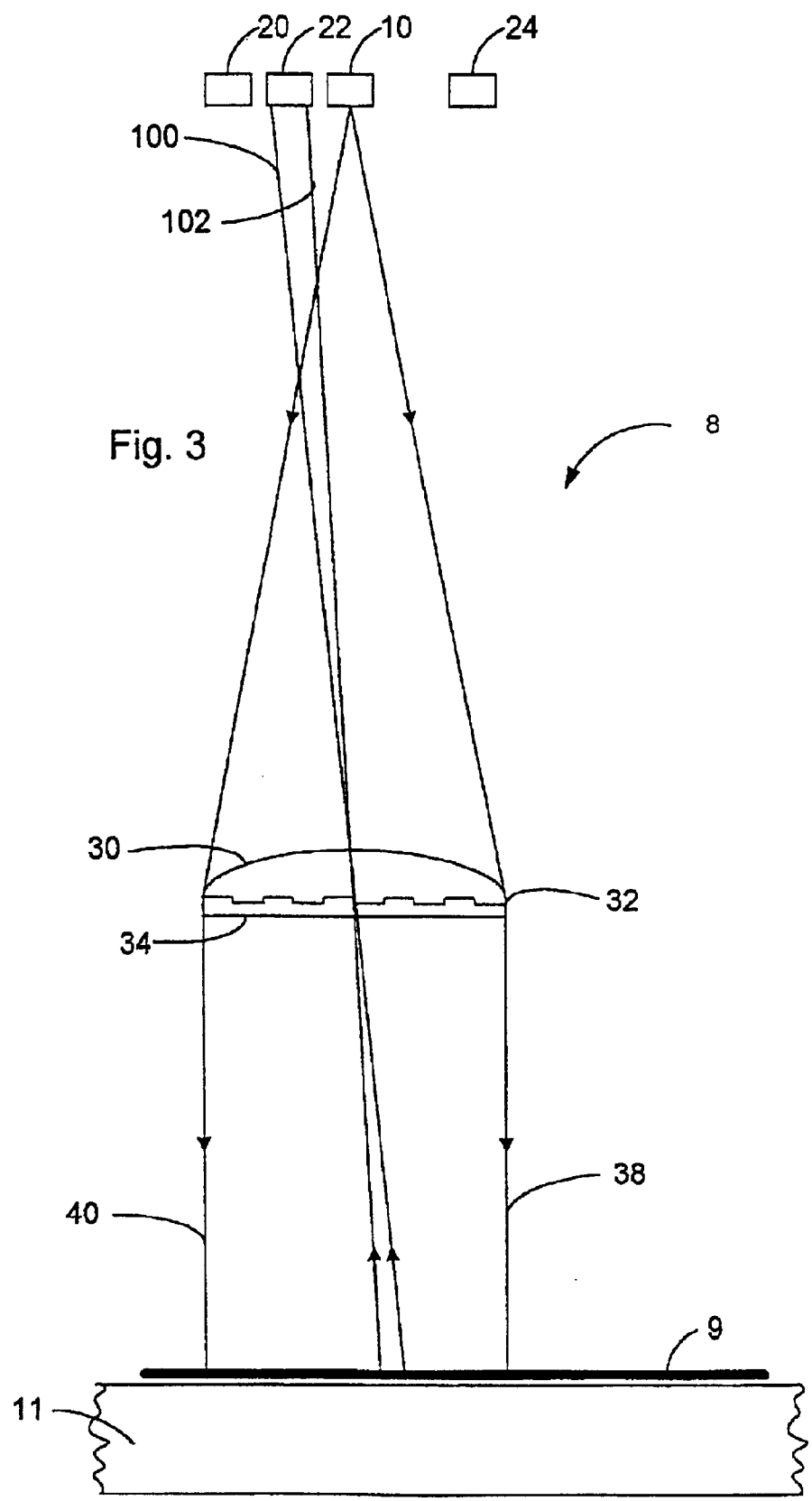
FIG. 3 shows the use of the detector of FIG. 1 in detecting the presence of a stationary sheet, in accordance with a preferred embodiment of the invention.

FIG. 3 shows the optional use of sensor 22 to detect the presence of that part of object 9 illuminated by the illuminating beam, regardless of its motion (e.g., jammed paper in a copying machine). The rays impinging on sensor 22 show the acceptance angle of the sensor, as determined by the sensor dimensions and the lens focal length. The determination of object presence is based on the output of sensor 22, which is responsive to the energy reflected from the object within the acceptance angle of sensor 22. Unlike sensors 20 and 24, sensor 22 is sensitive to reflected energy and not to the LO or movement. Lines 100 and 102 show the maximum angular deviation of beams from any portion of paper 9 which are accepted by sensor 22.

It should be understood that sensors 20 and 24 detect Doppler shifts only over that portion of their surface at which the LO is also present. Sensor 22 is not so restricted, such that the entire area of the sensor is useful for the measurement of power reflected from the surface of paper 9.

Figure 4:
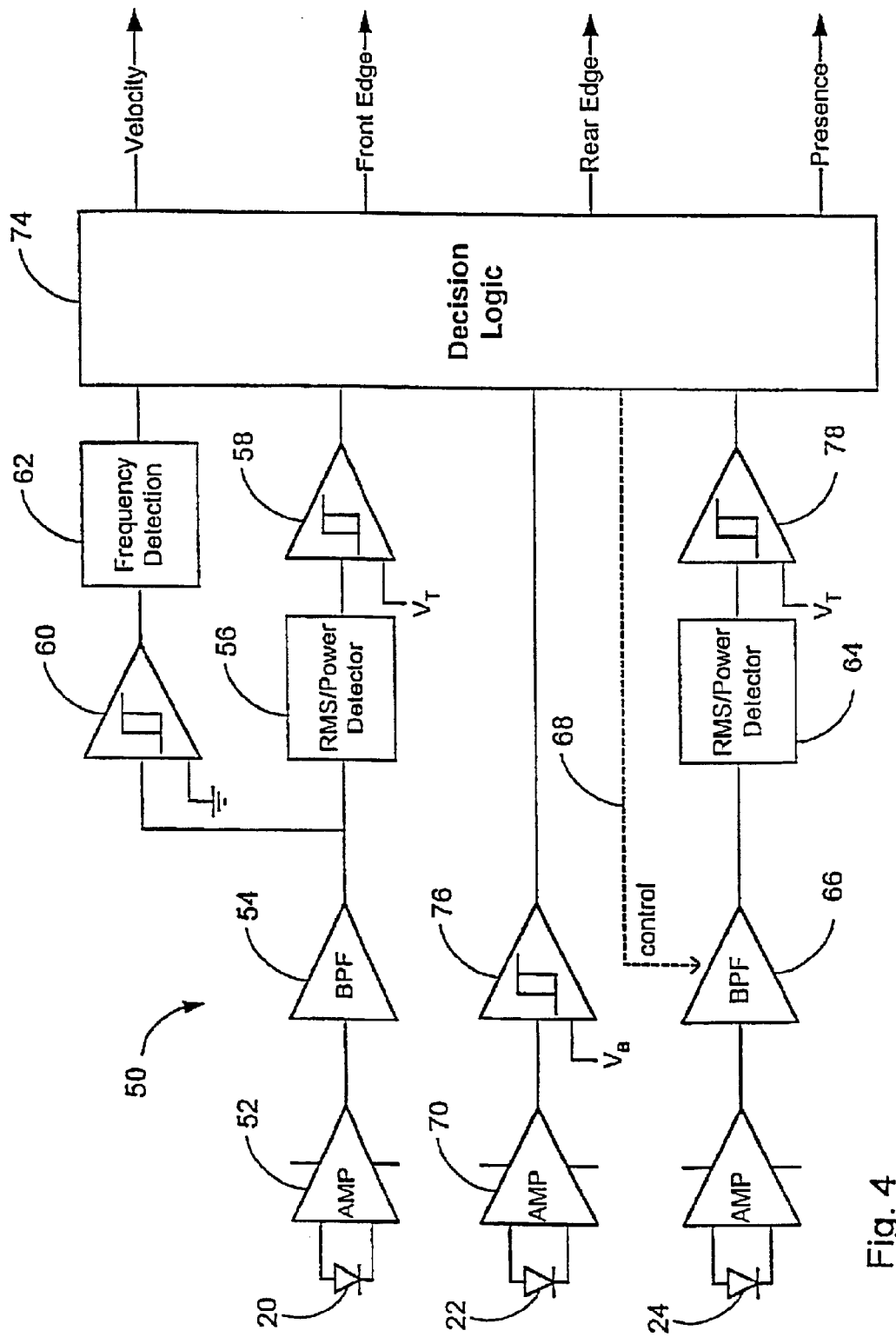
FIG. 4 is a schematic drawing of a circuit for processing the signals generated in edge detectors of the invention, useful for the detection of edges and the presence of a stationary sheet.

A schematic drawing of a detection circuit 50 for use with the detector of FIGS. 1–3 is shown in FIG. 4. The basic channel for front-edge detection includes a transimpedance amplifier 52 that transforms photodiode current from sensor 20 into voltage, a band-pass filter and amplifier 54 that amplifies the range of frequencies according to the expected Doppler shift. It also includes an energy detector 56 to detect the energy in this Doppler band. The output it set to 'high' logic level by comparator 58, when the edge of a moving paper enters the beam. The comparison level of comparator 58 is shown as a voltage $V_T$. $V_T$ is preferably chosen to be somewhat above the noise level to avoid false triggering. Preferably additionally, a comparator with hysteresis (Schmitt trigger) is used to avoid the effects of varying power level. The output stays high as long as the paper moves and reflection from the paper interferes with the local oscillate beam onto sensor 20. The output signal of energy detector 56 may be differentiated prior to comparison comparator 58.

A Schmitt-trigger 60 (or other comparator) and a frequency counter or detector 62 are preferably used to determine the object translation or velocity, respectively, when a measurement of such translation or velocity is desired. The comparator hysteresis or threshold is preferably set at a very low, noise determined voltage.

The rear-edge detection (based in sensor 24) is similar to the front-edge detection, except that the edge is identified as loss-of-power at the output of a power detector 64. Also, a rear edge detector band pass filter (BPF) 66 can be controlled responsive to the measured Doppler frequency of the front edge detector by a control line 68, to reduce noise. Preferably, the pass limits of filters 54 and 66 are matched to the expected Doppler frequency range, to limit noise.

The power in a 'presence' amplifier 70 is amplified and compared (in comparator or Schmitt trigger 76) to a background-rejection threshold $V_B$, to identify the presence of an object illuminated by the illumination beam, irrespective of its motion.

Circuit 50 also includes decision logic 74 which utilizes the outputs of the elements 62, 58, 78 and amplifier 76 to determine the velocity, front edge entry time, rear edge exit time and presence of the paper respectively, Optionally, decision logic 74 also determines paper spacing and length, as described above.

It is of interest to note that the present edge detection system does not generally need calibration for different types of paper or other substrates. In particular, since the thresholds $V_T$ are set based on system noise, the leading edge of substrates that reflect very little light (such as "black" surfaces) or substrates which scatter light only at their leading edge (such as transparencies) can be measured with the same system as that used for plain white paper.

Figure 5:
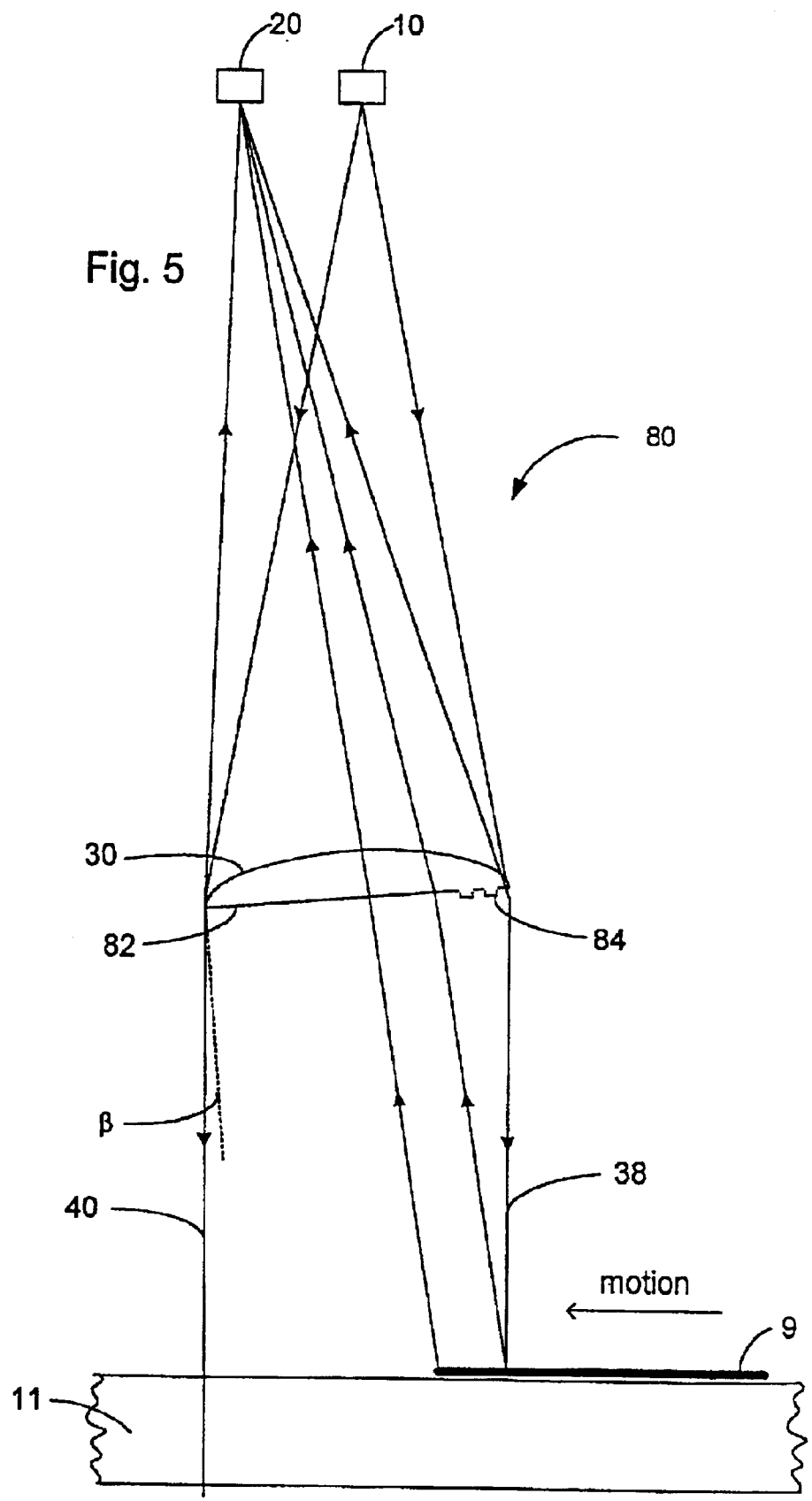
FIG. 5 is a schematic drawing of an edge detector, in accordance with an alternative preferred embodiment of the invention.

FIG. 5 shows an alternative preferred embodiment of a detector 80 (showing for convenience only front-edge detection), in which the local oscillator signal is generated by reflection from the outer interface 82 of collimating-focusing lens 30, tilted to provide for the collection of Doppler-shifted reflections from the surface. Preferably, the lens has a flat outer surface 82, providing for essentially identical, collimated transmission and reflection. Preferably, the amount of reflection is controlled (as in the embodiment of FIG. 1A) using a dielectric or metallic coating (not shown) on the outer surface, which preferably provides also scratch protection. Preferably, color filtering is used to eliminate interference from ambient light sources. For example, the lens may be a molded plastic lens with dye color filter combined into the mold.

The tilted flat surface of the lens provides for a single LO, for either front-edge detection (as in FIG. 5) or rear-edge detection (mirror image of FIG. 5 except for the object). The tilt angle corresponds to detection of reflection from the object with Doppler shift frequency according to $$F_D = \frac{V}{\lambda}\sin(2\beta),$$

where $F_D$ is the Doppler frequency, $\lambda$ is the source's wavelength, V is the object velocity and $\beta$ is the tilt angle between the normal to the reflecting surface and the illuminating beam exiting it.

While surface 82 is mostly flat to provide an LO, the edges of the lens are preferably provided with beam shaping optics 84 (shown in exaggerated dimensions in FIG. 5) to provide for the desired illumination edge at 38.

To provide for both front and rear edge detection, surface 82 is preferably formed of two sections, each having a different angle to the paper. Each of the actions is angled such that light reflected from the surfaces of the sections is directed to a respective sensor 20 or 24. The beam sections may be formed with their adjoining edge in either the direction of motion or in the perpendicular direction.

Figure 6A:
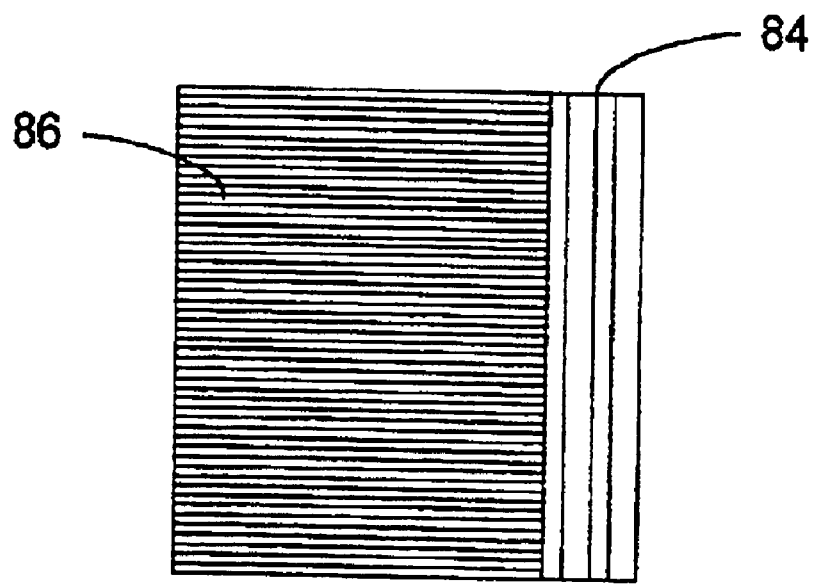
FIG. 6A shows a schematic view of diffractive grating for use in the edge detector of FIG. 5.
Figure 6B:
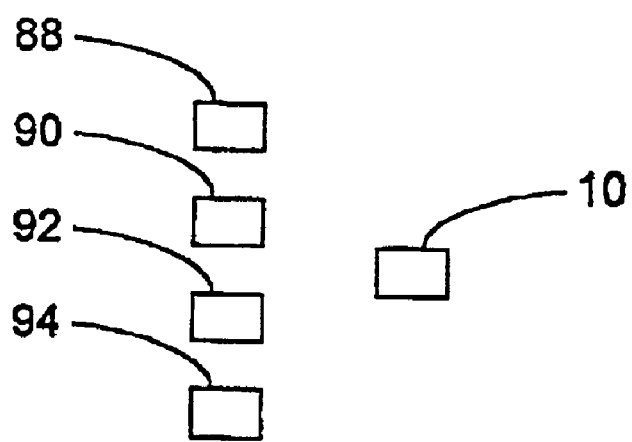
FIG. 6B show placement of detectors for use with the grating of FIG. 6A, in accordance with a preferred embodiment of the invention.

FIG. 6A shows a preferred embodiment of a reflector 86 for use at surface 82 of FIG. 5 in accordance with a preferred embodiment of the invention, in which the reflecting surface 86 at 82 is a grating. An array of sensors 88, 90, 92 and 94 is placed at the grating orders (FIG. 6B shows the sensor plane with four such sensors, however, other numbers of sensors may be used). The diffraction orders here are preferably perpendicular to the motion measurement direction. Thus, the Doppler shift measured by the sensors in the array is essentially the same. However, each of the sensors measures the motion using different reflection directions, thus the phase and the amplitude of the signals are basically independent of each other.

In a preferred embodiment of the invention, the multiplicity of independent signals is used for better detection probability. For example, the presence of the edge may be declared according to the first-to-rise signal of the sensor signals. Preferably, the threshold in each of the channels is raised to keep the false-alarm rate low, however, the multiplicity of sensors improves the detection probability and the edge determination accuracy, based on the significantly lower drop-out probability of multitude signals with respect to one signal.

According to a preferred embodiment of the invention, each two sensor signals are subtracted to form a difference signal. The difference signal power is on the average twice as large as each of the original signals, since the signals are largely uncorrelated. However, common-mode noise source (such as ambient lighting) and interference signals are reduced or eliminated. Amongst these, the subtraction decreases or eliminates a DC signal offset caused by the avenge reflectivity of the object (such as measured by sensor 22).

Common source noise may also be reduced or canceled in the embodiments of FIGS. 1–3 by subtraction of the signals from sensors 20 and 24. This subtracted signal will be free of (or have greatly reduced) common mode signal. It will rise when the front edge of the sheet is detected by sensor 20 and fall when sensor 24 ceases to detect the edge. Preferably, the thresholds should be low enough such that either signal causes a positive indication.

In addition, the sum of the frequency counts of sensor 20 and sensor 24 is essentially insensitive to height variations of the sheet, and is also virtually insensitive to small tilt of the edge detector.

While the present invention has been described with respect to preferred embodiments thereof, it is understood that other velocity or motion detectors, as known in the art, may be used in the practice of the invention. For example other types of optical motion detectors may be used and non-optical detectors can be used (for example ultrasound detectors). Also, while certain features have been shown in different ones of the embodiments, some preferred embodiments of the invention may have different combinations of the features shown or may have fewer features. As used herein the terms "have", "comprise" and "include" and their conjugates mean "including, but not necessarily limited to".

What is claimed is:

1. A method of detecting the passage of an edge of a moving sheet of material at a position, comprising:

illuminating a position with radiation;

detecting whether motion exists at the position, comprising determining if the power of Doppler shifted energy within a band of Doppler frequencies of radiation reflected at the position is above a threshold; and determining a time of passage of an edge of the sheet at the position as a time at which a change in whether motion exists at the position is detected.

2. A method according to claim 1 wherein determining comprises:

determining a time of passage of a leading edge as a time at which motion is first detected.

3. A method according to claim 1 wherein determining comprises:

determining a time of passage of a trailing edge of the sheet as a time at which detection of motion ceases.

4. A method according to claim 1 wherein detecting motion comprises optically detecting whether motion exists at the position.

5. A method according to claim 1 wherein the threshold for determining onset of motion is different from the threshold for determining cessation of motion.

6. A method according to claim 1 including providing a local oscillator field for determining the Doppler shifts.

7. A method according to claim 1 wherein a portion of the illuminating radiation is used as a local oscillator in detecting Doppler shifts.

8. A method according to claim 7 wherein the local oscillator comprises optical radiation reflected from a surface.

9. A method according to claim 7 wherein the local oscillator comprises radiation back diffracted from a diffracting surface.

10. A method according to claim 6 wherein the local oscillator is focused on a sensor used to detect the Doppler shifts.

11. A method according to claim 10 wherein the local oscillator is focused essentially to a point.

12. A method according to claim 1 wherein the position is comprised in an area illuminated by radiation, said area comprising an entrance side at which a sheet enters the area and an exit side at which the sheet leaves the area.

13. A method according to claim 12 wherein the radiation illuminating the area is formed to provide a sharp illumination boundary at at least one of the entrance and exit sides of said area.

14. A method according to claim 13 wherein the radiation illuminating the area is formed to provide a sharp illumination boundary at both the entrance and exit sides of the area.

15. A method according to claim 12 wherein the arrival of an edge is determined by Doppler energy produced at said entrance side of said area by a leading edge of said sheet.

16. A method according to claim 12, wherein a trailing edge is determined by a cessation of detection of Doppler energy from said exit side of said position from a trailing edge of said sheet.

17. A method according to claim 12 wherein the position has an extent between entrance and said exit side.

18. A method according to claim 17 wherein said extent is between about 1 mm and about 5 mm.

19. A method according to claim 18 wherein the extent is between about 2 mm and about 4 mm.

20. A method according to claim 19 wherein the extent is about 2 mm.

21. A method according to claim 12 and including detecting the presence of a non-moving sheet between the entrance and exit.

22. A method according to claim 12 and including measuring the velocity of the sheet.

23. A method according to claim 12 and including measuring a distance the sheet translates.

24. A method according to claim 4 wherein the radiation is IR radiation.

25. A method according to claim 4 wherein the radiation is laser illumination.

26. A method according to claim 1 wherein the time at which a sheet enters the position is determined to an accuracy better than about 0.5 mm/V sec, where V is the velocity of the sheet.

27. A method according to claim 26 wherein the accuracy is better than 0.1 mm/V sec.

* * * * *